(12) United States Patent
Dunwoody et al.

(10) Patent No.: US 8,441,793 B2
(45) Date of Patent: May 14, 2013

(54) UNIVERSAL RACK BACKPLANE SYSTEM

(75) Inventors: John Craig Dunwoody, Belmont, CA (US); Teresa Ann Dunwoody, Belmont, CA (US)

(73) Assignee: Birchbridge Incorporated, Belmont, CA (US)

( * ) Notice: Subject to any disclaimer, the term of this patent is extended or adjusted under 35 U.S.C. 154(b) by 330 days.

(21) Appl. No.: 12/840,808

(22) Filed: Jul. 21, 2010

(65) Prior Publication Data
US 2012/0020008 A1    Jan. 26, 2012

(51) Int. Cl.
*H05K 7/20* (2006.01)
*H01R 9/05* (2006.01)
*F28F 7/00* (2006.01)

(52) U.S. Cl.
USPC ...... 361/699; 361/727; 361/679.53; 361/788; 439/581; 165/80.4; 165/104.26

(58) Field of Classification Search ............. 361/679.01, 361/724–727; 211/26; 248/165
See application file for complete search history.

(56) References Cited

U.S. PATENT DOCUMENTS

| | | |
|---|---|---|
| 3,675,083 A | 7/1972 | White |
| 3,800,097 A | 3/1974 | Maruscak et al. |
| 4,511,950 A | 4/1985 | Bunner et al. |
| 4,514,746 A | 4/1985 | Lundqvist |
| 4,685,032 A | 8/1987 | Blomstedt et al. |
| 4,938,279 A | 7/1990 | Betker |
| 5,006,961 A | 4/1991 | Monico |
| 5,390,081 A | 2/1995 | St. Pierre |
| 5,450,272 A | 9/1995 | Van Gaal et al. |
| 5,603,044 A | 2/1997 | Annapareddy et al. |
| 5,971,804 A * | 10/1999 | Gallagher et al. ............ 439/581 |
| 5,991,163 A | 11/1999 | Marconi et al. |
| 6,195,493 B1 | 2/2001 | Bridges |
| 6,310,783 B1 * | 10/2001 | Winch et al. .................. 361/797 |
| 6,365,964 B1 | 4/2002 | Koors et al. |
| 6,498,716 B1 | 12/2002 | Salinas et al. |
| 6,536,510 B2 | 3/2003 | Khrustalev et al. |
| 6,629,614 B2 | 10/2003 | Jordan |
| 6,836,030 B2 | 12/2004 | Smith et al. |
| 7,051,215 B2 | 5/2006 | Zimmer et al. |
| 7,076,592 B1 | 7/2006 | Ykema |
| 7,138,733 B2 * | 11/2006 | Sanders et al. ................ 307/147 |
| 7,222,339 B2 | 5/2007 | Rothman et al. |
| 7,278,273 B1 | 10/2007 | Whitted et al. |
| 7,312,987 B1 | 12/2007 | Konshak |
| 7,389,046 B1 | 6/2008 | Tanaka et al. |

(Continued)

FOREIGN PATENT DOCUMENTS

WO    WO 2012/012611 A2    1/2012

OTHER PUBLICATIONS

International Search Report for International Application No. PCT/US2011/044809, mailed Jan. 31, 2012.

*Primary Examiner* — Zachary M Pape
(74) *Attorney, Agent, or Firm* — Alston & Bird LLP

(57) ABSTRACT

Disclosed is an embodiment of a rack system including a universal hardware platform having a frame, a module insertion area on a first side of the rack system and a universal backplane area on a second side of the rack system opposite to the first side, a power bus, a plurality of partitions, a plurality of module bays, and two or more service unit backplanes. The power bus may be configured to provide power to the modules coupled to the universal backplane area.

19 Claims, 7 Drawing Sheets

U.S. PATENT DOCUMENTS

| | | |
|---|---|---|
| 7,408,775 B2 | 8/2008 | Walz et al. |
| 7,508,670 B1 | 3/2009 | Thorson et al. |
| 7,511,959 B2 | 3/2009 | Belady et al. |
| 7,511,960 B2 | 3/2009 | Hillis et al. |
| 7,551,971 B2 | 6/2009 | Hillis |
| 7,552,758 B2 | 6/2009 | Garner et al. |
| 7,597,582 B2 | 10/2009 | Nehling et al. |
| 7,619,893 B1 | 11/2009 | Yu |
| 7,646,109 B2 | 1/2010 | Belady et al. |
| 7,673,389 B2 | 3/2010 | Lehman et al. |
| 7,713,068 B2 | 5/2010 | Flynn et al. |
| 7,715,207 B2 | 5/2010 | Behrens et al. |
| 7,724,513 B2 | 5/2010 | Coglitore et al. |
| 7,738,251 B2 | 6/2010 | Clidaras et al. |
| 7,852,627 B2 | 12/2010 | Schmitt et al. |
| 7,854,652 B2 | 12/2010 | Yates et al. |
| 7,856,838 B2 | 12/2010 | Hillis et al. |
| 7,894,945 B2 | 2/2011 | Hillis |
| 7,907,409 B2 * | 3/2011 | Wyatt et al. .................... 361/700 |
| 7,952,023 B2 | 5/2011 | Caveney et al. |
| 7,952,873 B2 | 5/2011 | Glahn et al. |
| 7,957,144 B2 | 6/2011 | Goettert et al. |
| 7,983,194 B1 | 7/2011 | Genetti et al. |
| 7,990,710 B2 | 8/2011 | Hellriegel et al. |
| 8,047,904 B2 | 11/2011 | Yates et al. |
| 8,077,457 B2 | 12/2011 | Gauthier et al. |
| 8,094,453 B2 | 1/2012 | Campbell et al. |
| 8,259,450 B2 * | 9/2012 | Dunwoody et al. .......... 361/699 |
| 2003/0112582 A1 | 6/2003 | Sanders et al. |
| 2004/0221604 A1 | 11/2004 | Ota et al. |
| 2005/0021847 A1 | 1/2005 | Rothman et al. |
| 2005/0213306 A1 | 9/2005 | Vos et al. |
| 2006/0082263 A1 | 4/2006 | Rimler et al. |
| 2007/0247825 A1 * | 10/2007 | Bynum et al. ................ 361/788 |
| 2008/0055846 A1 | 3/2008 | Clidaras et al. |
| 2008/0094797 A1 | 4/2008 | Coglitore et al. |
| 2008/0205003 A1 | 8/2008 | Belady |
| 2008/0259555 A1 | 10/2008 | Bechtolsheim et al. |
| 2009/0126910 A1 | 5/2009 | Campbell et al. |
| 2009/0159241 A1 | 6/2009 | Lipp et al. |
| 2009/0229194 A1 | 9/2009 | Armillas |
| 2009/0237887 A1 | 9/2009 | Shibata |
| 2009/0301123 A1 | 12/2009 | Monk et al. |
| 2010/0020806 A1 | 1/2010 | Vahdat et al. |
| 2010/0051563 A1 | 3/2010 | Schreiber |
| 2010/0165565 A1 | 7/2010 | Hellriegal et al. |
| 2010/0254096 A1 | 10/2010 | Kim et al. |
| 2011/0119344 A1 | 5/2011 | Eustis |
| 2011/0157829 A1 | 6/2011 | Wormsbecher et al. |
| 2011/0175498 A1 | 7/2011 | Bash et al. |
| 2011/0175499 A1 | 7/2011 | Zhao et al. |
| 2011/0239680 A1 | 10/2011 | Dechene et al. |
| 2012/0018136 A1 | 1/2012 | Dunwoody et al. |
| 2012/0019117 A1 | 1/2012 | Dunwoody et al. |
| 2012/0020024 A1 | 1/2012 | Dunwoody et al. |
| 2012/0020349 A1 | 1/2012 | Dunwoody et al. |

* cited by examiner

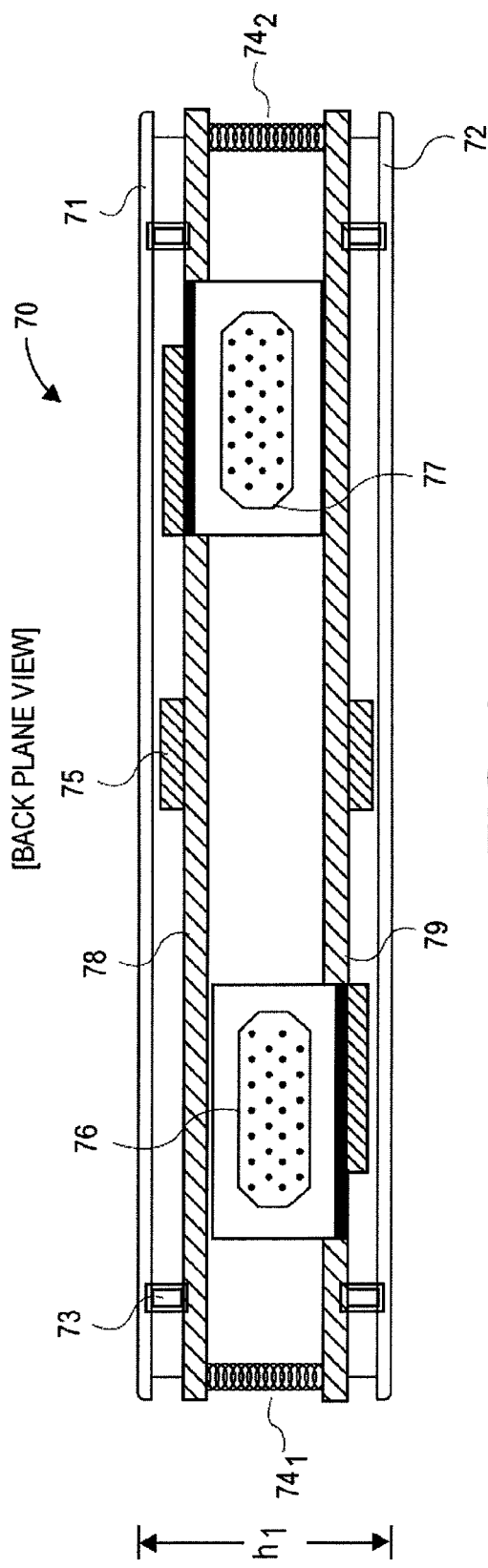
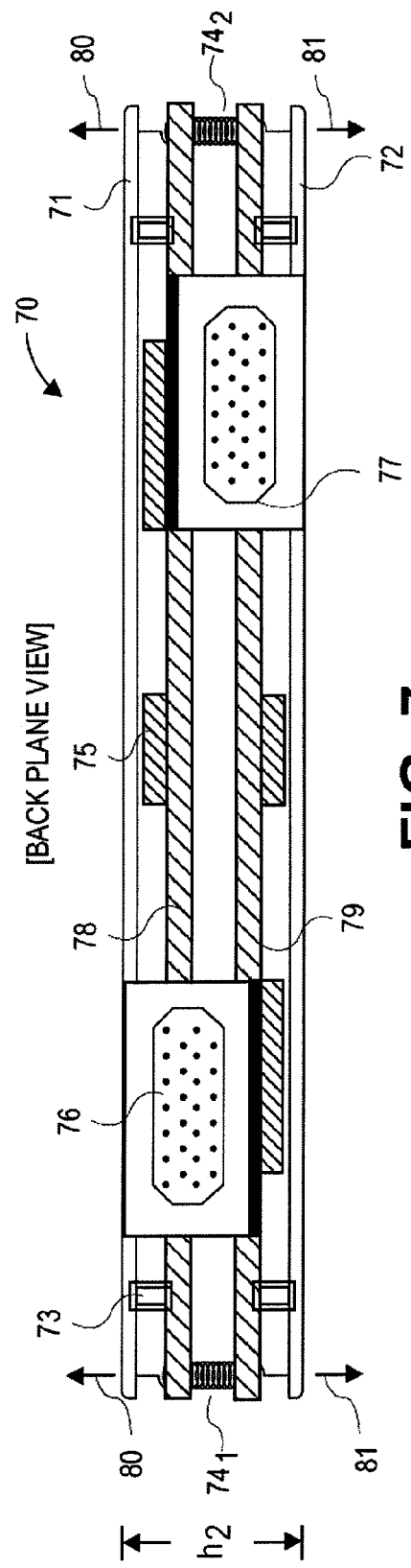

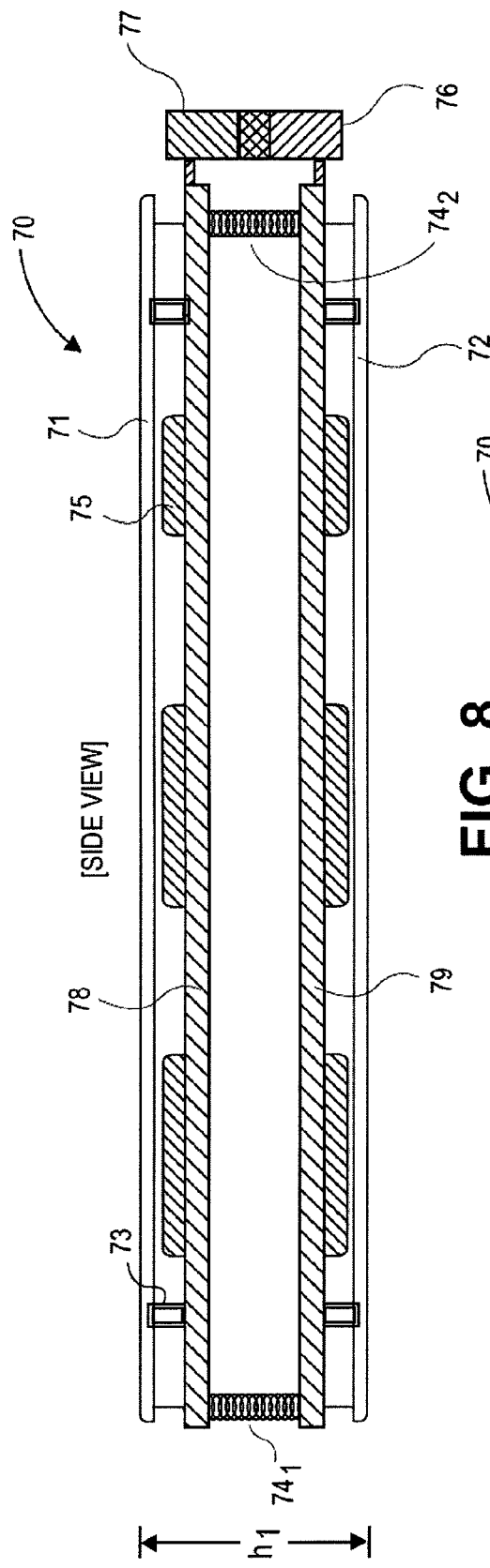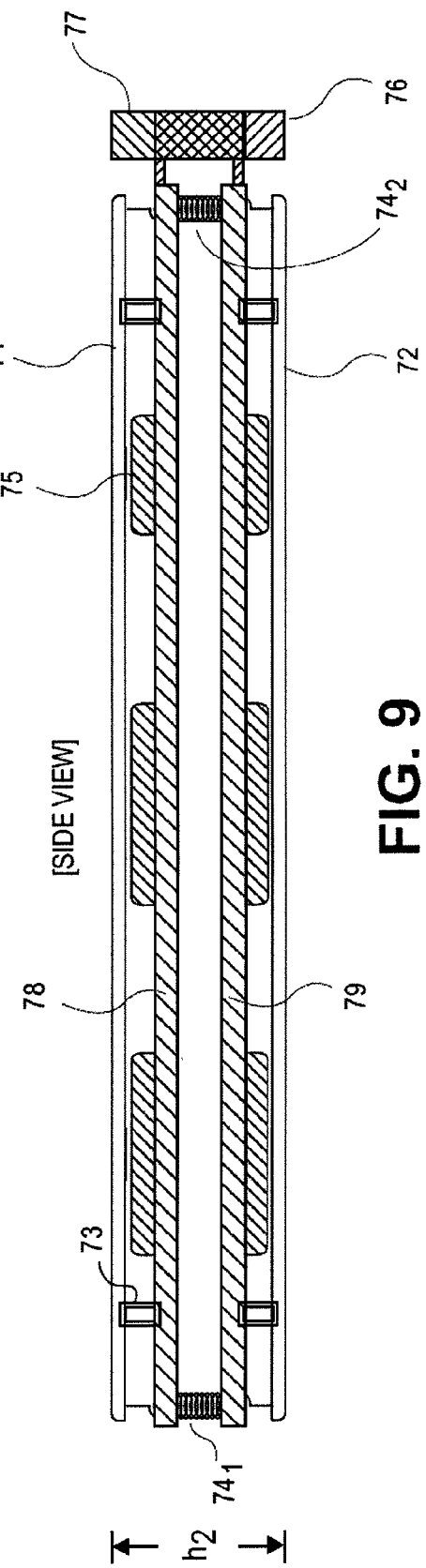

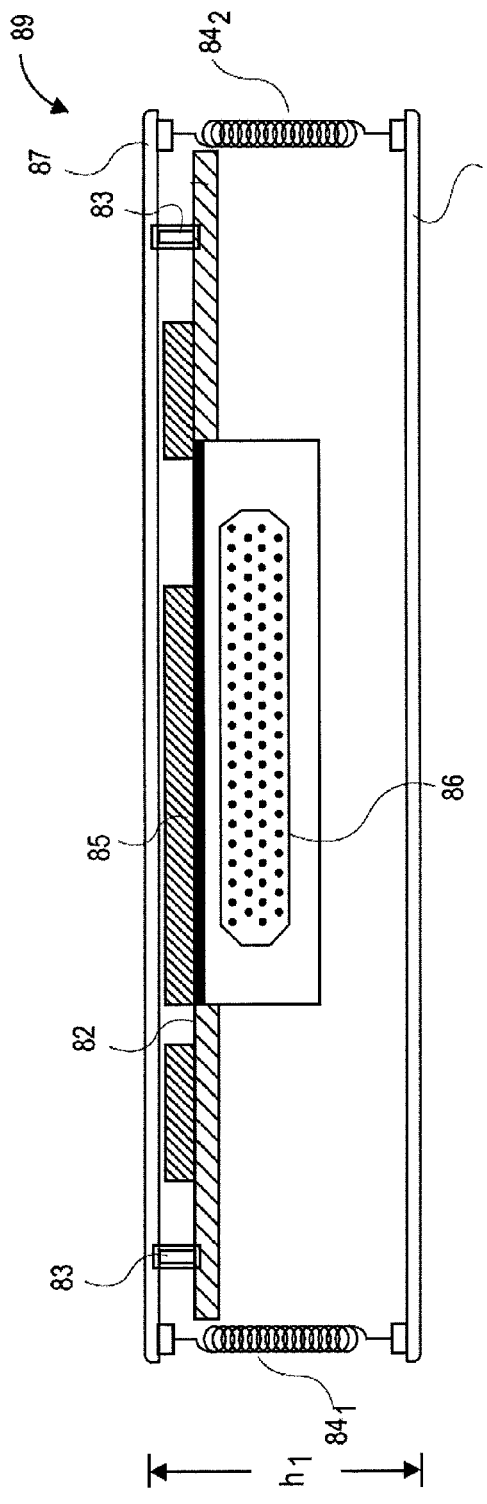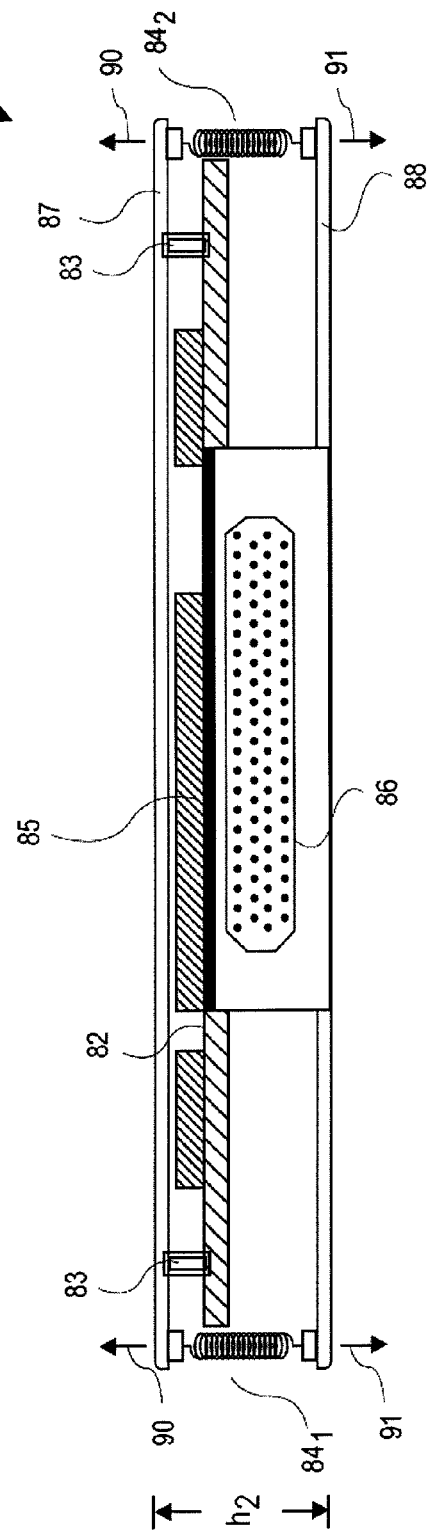

UNIVERSAL RACK BACKPLANE SYSTEM

RELATED APPLICATIONS

This application is related to application Ser. Nos. 12/840,871 (now U.S. Pat. No. 8,410,364), 12/840,788, 12/840,857 (now U.S. Pat. No. 8,259,450, 12/840,842, and 12/840,824 (now U.S. Pat. No. 8,411,440) each filed Jul. 21, 2010, and incorporated herein by reference in its entirety.

FIELD

This application relates to embodiments pertaining to rack mounted computer system, and in particular, a universal rack backplane system.

BACKGROUND

Current standard rack configurations are measured in rack-units (RUs). For example, a blade server may have a rack unit measuring 19 inches wide and having a pitch of 1.75 inches in height. A common computer rack form-factor is 42 RU high, which is a factor in limiting the density or number of components directly mountable into a rack. Higher density component systems are desirable since they require less space per rack enclosure and ultimately less space within the building housing the enclosures. Often these buildings must include high price high maintenance false floors to accommodate the mass of cabling and the delivery of chilled air and power to the enclosures. Another factor in determining component density is the pitch of the rack unit as often limited by the space required for component heat sinks and associated cooling components (e.g., fans).

Typically, a rack configuration is specialized and configured to perform a single function, such as server node. In this case, the rack is designed to accommodate only those rack components (e.g., modules and backplanes), which are repeated throughout the rack, for the particular designed to function. In other words, the rack unit lacks flexibility to change. For example, if requirements change that demand a new functionality or if the form factor changes for the current function, a new rack must be created to implement the new or changed hardware.

SUMMARY

In an exemplary embodiment, a rack frame is provided. The rack frame may include a module insertion area, a universal backplane area and a power bus. The module insertion area may be provided on a first side of the rack frame. The universal backplane area may be provided on a second side of the rack frame opposite to the first side. The universal backplane area may include at least one mounting surface configured to mount two or more backplane boards. In some cases, at least two of the backplane boards are configured to couple to two respective modules each having at least two different functions and are insertable through the module insertion area. The at least two different functions of at least one backplane board may include rack power and management functions. The power bus may provide power to the two or more backplane boards mounted in the universal backplane area.

In another exemplary embodiment, a universal backplane is provided. The universal backplane may include a first backplane board and a second backplane board. Each backplane board may include a plurality of connector receptacles in which each connector receptacle is configured to receive backplane connectors from respective ones of a plurality of modules that are mountable in a same side of a rack to which the first and second backplane boards are connectable. At least one of the first backplane board or the second backplane board may include a fixed function backplane board for power and management control functions of the modules insertable into the rack.

BRIEF DESCRIPTION OF THE DRAWINGS

The present invention is illustrated by way of example, and not by way of limitation, in the figures of the accompanying drawings in which:

FIGS. 6 and 7 illustrate embodiments of a module fixture that includes circuit cards and components that make up a functional module in a service unit;

FIGS. 8 and 9 illustrate embodiments of the module fixture from a side view in a compressed and uncompressed state respectively; and FIGS. 10 and 11 illustrate embodiments of a module fixture for a rack power board insertable into the rack power section of the rack system.

DETAILED DESCRIPTION

Although an embodiment of the present invention has been described with reference to specific example embodiments, it will be evident that various modifications and changes may be made to these embodiments without departing from the broader spirit and scope of the invention. Accordingly, the specification and drawings are to be regarded in an illustrative rather than a restrictive sense.

Embodiments of the present invention generally relate to an architecture for a scalable modular data system. In this regard, embodiments of the present invention relate to a rack system (e.g., rack system 10) that may contain a plurality of service units or modules. The rack system described herein provides physical support, power, and cooling for the service units or modules contained therein. The rack system also provides a set of interfaces for the service units or modules including mechanical, thermal, electrical, and communication protocol specifications. Moreover, the rack system described herein may be easily networked with a plurality of instances of other rack systems to create the highly scalable modular architecture referenced above.

Each service unit or module that may be housed in the rack system provides some combination of processing, storage, and communication capacity enabling the service units to provide functional support for various computing, data processing and storage activities (e.g., as servers, storage arrays, network switches, etc.). However, embodiments of the present invention provide a mechanical structure for the rack system and the service units or modules that provides for efficient heat removal from the service units or modules in a compact design. Thus, the amount of processing capability that can be provided for a given amount of energy consumption may be increased.

Figure 1:
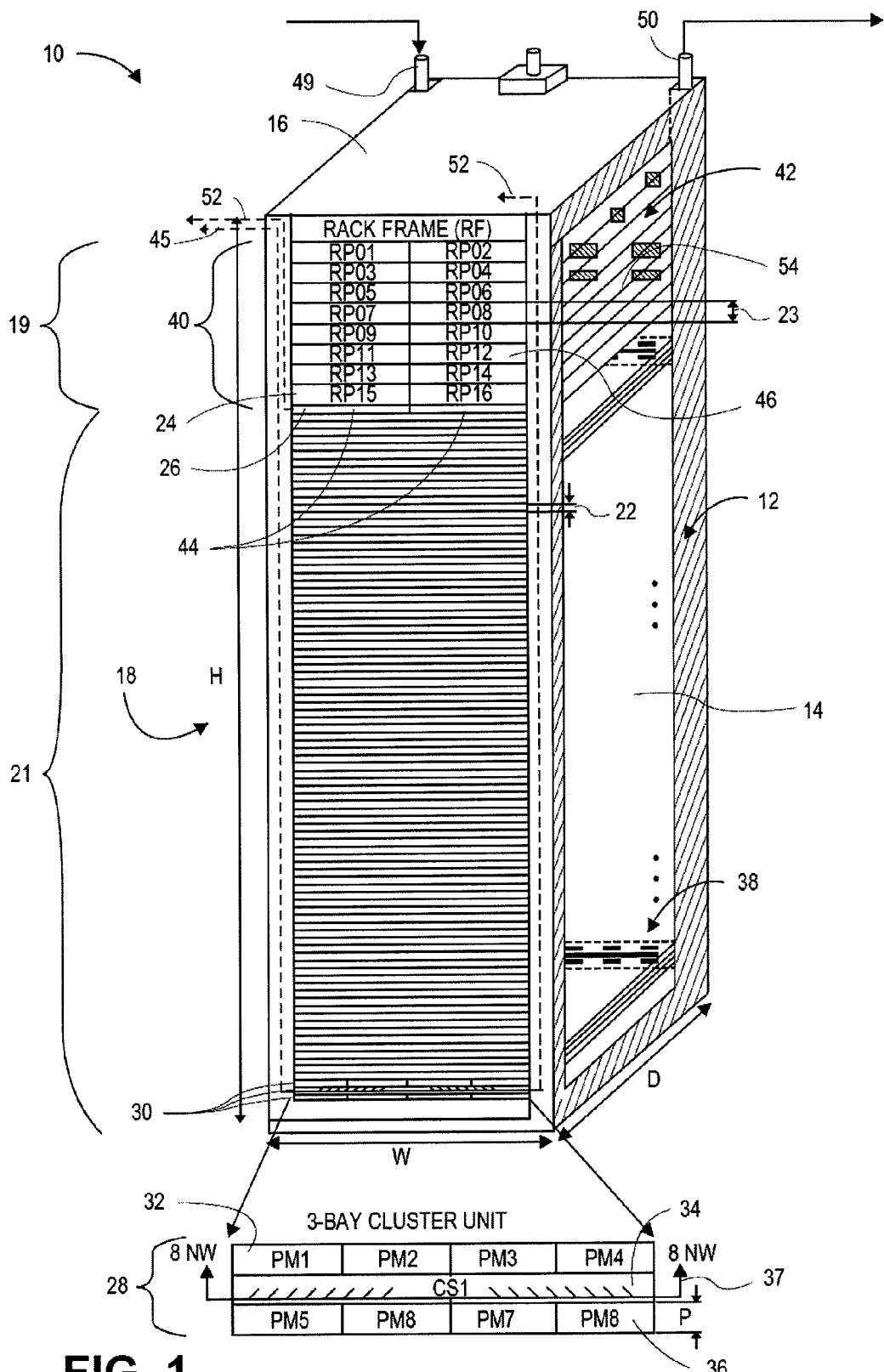
FIG. 1 illustrates an embodiment of a rack system including a cooled universal hardware platform.

FIG. 1 illustrates an embodiment of a rack system 10. Rack system 10 includes a rack power section 19 and a universal hardware platform 21. The universal hardware platform 21 includes a universal backplane mounting area 14. The rack system 10 has a perimeter frame 12 having a height 'H' width 'W' and depth 'D.' In one embodiment, the perimeter frame 12 includes structural members around the perimeter of the rack system 10 and is otherwise open on each vertical face. In other embodiments some or all of the rack's faces or planes may be enclosed, as illustrated by rack top 16.

The front side of the rack, rack front 18, may include a multitude of cooled partitions substantially parallel to each other and at various pitches, such as pitch 22 (P), where the pitch may be equal to the distance between the first surface of one cooled partition to the second surface of an adjacent cooled partition. The area or volume between each partition defines a module bay, such as module bay 24 or module bay 26. Each module bay may have a different size based on their respective pitches, such as pitch 22 corresponding to module bay 26 and pitch 23 corresponding to module bay 24. It can be appreciated that the pitch may be determined any number of ways, such as between the mid lines of each partition or between the inner surfaces of two consecutive partitions. In one embodiment, the pitch 22 is a standard unit of height, such as 0.75 inches, and variations of the pitch, such as pitch 23, may be a multiple of the pitch 23. For example, pitch 23 is two times the pitch 22, where pitch 22 is the minimum pitch based on module or other design constraints.

The rack system 10, and specifically the universal hardware platform 21, may be configured to include a multitude of service units. Each service unit may provide a combination of data processing capacity, data storage capacity, and data communication capacity. In one embodiment the rack system 10 provides physical support, power, and cooling for each service unit that it contains. A service unit and its corresponding service unit backplane correspond to a rack unit model. The rack unit model defines a set of interfaces for the service unit, which include mechanical, thermal, electrical, and communication-protocol specifications. Thus, any service unit that conforms to the interfaces defined by a particular rack unit model may be installed and operated in a rack system that includes the corresponding service unit backplane. For example, the service unit backplane mounts vertically to the universal backplane mounting area 14 and provides the connections according to the rack unit model for all of the modules that perform the functions of the service unit.

Cluster unit 28 is an example of a service unit configured to provide processing and switching functions to sixteen data nodes. In this embodiment, the cluster unit 28 spans over three module bays, module bays 30, and includes eight processing modules and a cluster switch. Specifically, the cluster unit 28 includes the four processing modules 32 (PM1-PM4) in the first module bay, a cluster switch 34 (CS1) in the second module bay, and the remaining processing modules 36 (PM5-PM8) in the third module bay.

Each of these modules may slide into their respective slots with the module bay and connect into a service unit backplane, such as cluster unit backplane 38. The cluster unit backplane 38 may be fastened to the perimeter frame 12 in the universal backplane mounting area 14. The combination of the cluster switch 34 and the cluster unit backplane 38 in this embodiment has the advantage of signal symmetry, where the signal paths of the processing modules 32 and 36 are equidistant to the cluster switch 34.

In one embodiment, the cluster switch 34 has 8 network lines exiting out of the front of the cluster switch 34 at a forty-five degree angle toward each side of the rack front 18, see for example network lines 37. For simplicity, only one cluster switch (e.g., cluster switch 34) is shown, however it can be appreciated that a multitude of cluster switches may be included in the rack system 10. Thus, the network lines for every installed cluster switch may run up the perimeter frame 12 and exit the rack top 16 in a bundle, as illustrated by net 52.

In various embodiments, some or all of the service units, such as the cluster unit 28 including the processing modules 32 and the cluster switch 34, are an upward-compatible enhancement of mainstream industry-standard high performance computing (HPC)-cluster architecture, with x86_64 instruction set architecture (ISA) and standard Infiniband networking interconnects. This enables one hundred percent compatibility with existing system and application software used in mainstream HPC cluster systems and is immediately useful to end-users upon product introduction, without extensive software development or porting. Thus, implementation of these embodiments includes using commercial off the shelf (COTS) hardware and firmware whenever possible, and does not include any chip development or require the development of complex system and application software. As a result, these embodiments dramatically reduce the complexity and risk of the development effort, improve energy efficiency, and provide a platform to enable application development for concurrency between simulation and visualization computing to thereby reducing data-movement bottlenecks. The efficiency of the architecture of the embodiments applies equally to all classes of scalable computing facilities, including traditional enterprise-datacenter server farms, cloud/utility computing installations, and HPC clusters. This broad applicability maximizes the ability for significant improvements in energy and environmental efficiency of computing infrastructures. However, it should be noted that custom circuit and chip designs could also be used in the disclosed rack system design, but would not likely be as cost effective as using COTS components.

Returning to the discussion of FIG. 1, the cluster unit backplane 38 may be a single circuit board with connectors corresponding to their counterpart connectors on each module of the cluster unit 28, and the cluster unit backplane 38 may have a height of approximately the height of the (three) module bays 30. In other embodiments, the cluster unit backplane 38 may be composed of two or more circuit boards with corresponding connectors, or the cluster unit backplane 38 may be single circuit board that supports two or more cluster units (e.g., cluster unit 28) over a multitude of module bays.

The optional rack power section 19 of the rack system 10 may include rack power and management unit 40 composed of two rack management modules 44 and a plurality of rack power modules 46 (e.g., RP01-RP16). In another embodiment, the rack management modules 44 and a corresponding rack management backplane (not shown) may be independent of the rack power unit 40 and may be included in the universal hardware platform 21. In one embodiment, there may be two modules per module bay, such as the two rack power modules in module bay 24 and the two rack management modules 44 in module bay 26.

The rack management modules 44 may provide network connectivity to every module installed in the rack system 10. This includes every module installed in the universal hardware platform 21 and every module of the rack power section 19. Management cabling 45 provides connectivity from the rack management modules 44 to devices external to the rack system 10, such as networked workstation or control panel (not shown). This connectivity may provide valuable diagnostic and failure data from the rack system 10 and in some embodiments provide an ability to control various service units and modules within the rack system 10.

As with the backplane boards of the universal hardware platform 21, the back plane area corresponding to the rack power section 19 may be utilized to fasten one or more backplane boards. In one embodiment, a rack power and management backplane 42 is a single backplane board with connectors corresponding to their counterpart connectors on each of the rack management modules 44 and the rack power modules 46 of the rack power and management unit 40. The rack power and management backplane 42 may then have a height of approximately the height of the collective module bays corresponding to the rack power and management unit 40. In other embodiments, the rack power and management backplane 42 may be composed of two or more circuit boards with corresponding connectors.

In one embodiment, the rack power modules 46 are connected to the power inlet 48 (See e.g., FIGS. 2 and 3), which may be configured to receive three-phase alternating current (AC) power from a source external to the rack system 10. The rack power modules 46 convert the three-phase AC into direct current (DC). For example, the rack power modules 46 may convert a 480 volt three-phase AC input to 380 volt DC for distribution in the rack system 10. In one embodiment, the DC voltage from the rack power modules 46 is connected to power bus 67 (See e.g., FIGS. 2 and 3) running down from the rack power and management backplane 42 to other service unit backplanes, such as the cluster unit backplane 38.

The rack system 10 may include a coolant system having a coolant inlet 49 and coolant outlet 50. The coolant inlet 49 and the coolant outlet 50 are connected to piping running down through each partition's coolant distribution nodes (e.g., coolant distribution node 54) to provide the coolant into and out of the cooled partitions. For example, coolant (refrigerant R-134a) flows into the coolant inlet 49, through a set of vertically spaced, 0.1 inch thick horizontal cooled partitions (discussed below with reference to FIGS. 3 and 4) and out of the coolant outlet 50. As discussed above, the space between each pair of adjacent cooled partitions is a module bay. Waste heat is transferred via conduction, first from the components within each module (e.g., processing modules 32) to the module's top and bottom surfaces, and then to the cooled partitions at the top and bottom of the module bay (e.g., module bays 30). Other coolant distribution methods and hardware may also be used without departing from the scope of the embodiments disclosed herein.

Thus, embodiments of the rack system 10 including one or all of the compact features based on modularity, cooling, power, pitch height, processing, storage and networking provide, among others, energy efficiency in system manufacturing, energy efficiency in system operation, cost efficiency in system manufacturing and installation, cost efficiency in system maintenance, space efficiency of system installations, and environmental impact efficiency throughout the system lifecycle.

Figure 2:
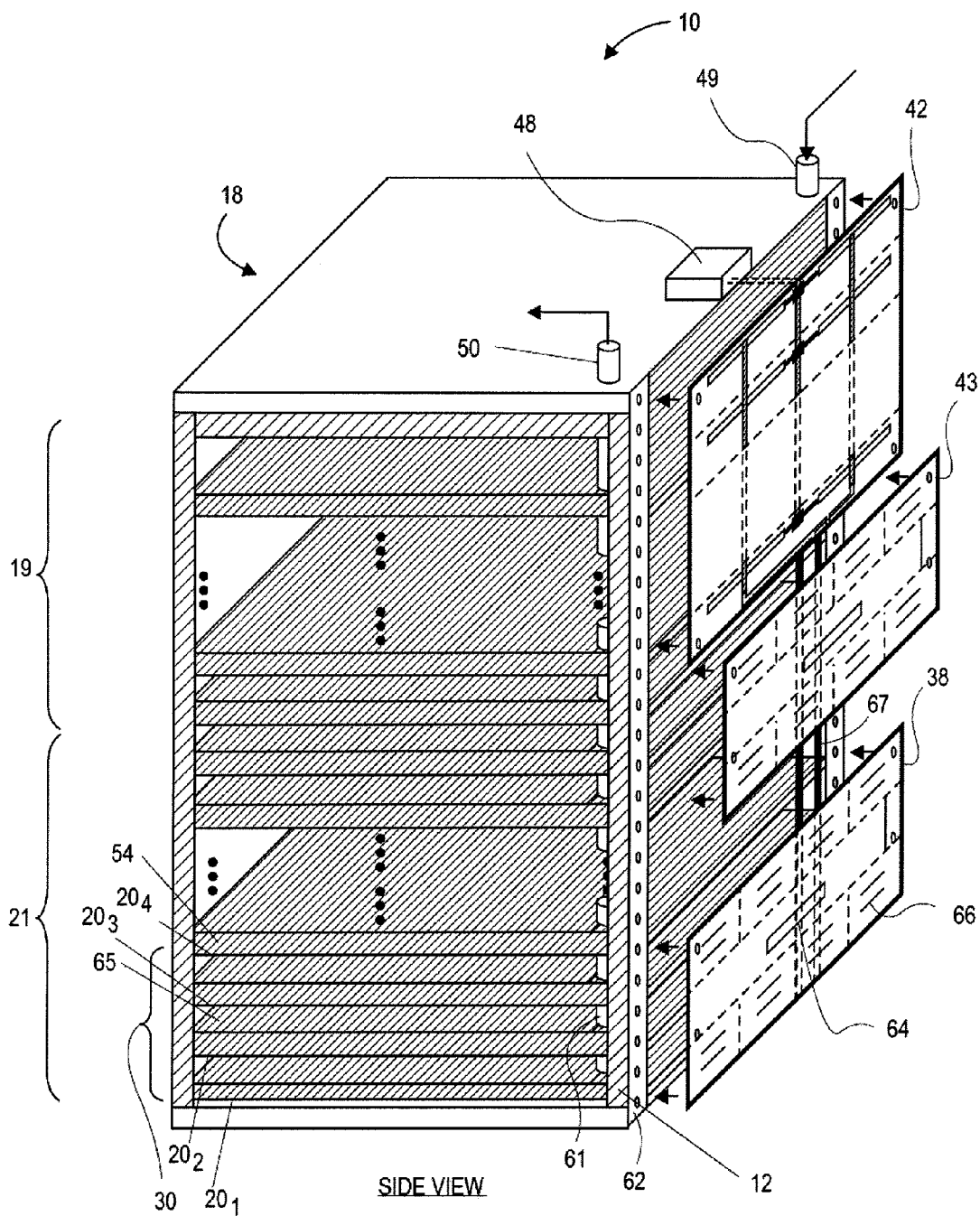
FIG. 2 illustrates a portion of the side of the rack system and the cooled universal hardware platform, according to one embodiment.

FIG. 2 illustrates a portion of the side of the rack system 10, according to one embodiment. FIG. 2 shows the rack power section 19 and the universal hardware platform 21 as seen form an open side and rear perspective of the rack system 10. The three module bays of the module bays 30 are made up of four cooled partitions, cooled partitions $20_1$, $20_2$, $20_3$, and $20_4$. Each module bay includes two partitions, in this embodiment an upper and a lower partition. For example, module bay 65 is the middle module bay of the three module bays, module bays 30, and has cooled partition $20_2$ as the lower cooled partition and $20_3$ as the upper cooled partition. As will be discussed in further detail below, functional modules may be inserted into module bays, such as module bay 65, and thermally couple to the cooled partitions to cool the modules during operation.

The coolant distribution node 54 is illustrated on cooled partition $20_4$, and in this embodiment, is connected to the coolant distribution nodes of other cooled partitions throughout the rack via coolant pipe 61 running up the height of the rack and to the coolant outlet 50. Similarly, coolant pipe 63 (See e.g., FIG. 5) is connected to the opposite end of each of the cooled partitions at a second coolant distribution node and the coolant inlet 49.

The perimeter frame 12 of the rack system 10 may include a backplane mounting surface 62 where the service unit backplanes are attached to the perimeter frame 12, such as the cluster unit backplanes 38 and 43 of the universal hardware platform 21, and the rack power and management backplane 42 of the rack power section 19. In various embodiments, the backplane mounting surface 62 may include mounting structures that conform to a multiple of a standard pitch size (P), such as pitch 22 shown in FIG. 1. The mounting structures on the surface of the service unit backplanes as well as the backplanes themselves may be configured to also conform with the standard pitch size. For example, the cluster unit backplane 38 may have a height of approximately the height of module bays 30 corresponding to a pitch of 3P, and accordingly the structures of the backplane mounting surface 62 are configured to align with the mounting structures of the cluster unit backplane 38.

In various embodiments, the mounting structures for the backplane mounting surface 62 and the service units (e.g., cluster unit 28) may be magnetic, rails, indentations, protrusions, bolts, screws, or uniformly distributed holes that may be threaded or configured for a fastener (e.g., bolt, pin, etc.) to slide through, attach or snap into. Embodiments incorporating the mounting structures set to a multiple of the pitch size have the flexibility to include a multitude of backplanes corresponding to various functional types of service units that may be installed into the module bays of the universal hardware platform 21 of the rack system 10.

When mounted, the service unit backplanes provide a platform for the connectors of the modules (e.g., processing modules 36 of service unit 28) to couple with connectors of the service unit backplane, such as the connectors 64 and 66 of the cluster unit backplane 38 and the connectors associated with the modules of cluster unit 28 described above. The connectors are not limited to any type and may be, for example, an edge connector, pin connector, optical connector, or any connector type or equivalent in the art. Because multiple modules may be installed into a single module bay, the cooled partitions may include removable, adjustable or permanently fixed guides (e.g., flat brackets or rails) to assist with the proper alignment of the modules with the connectors of the backplane upon module insertion. In another embodiment, a module and backplane may include a guide pin and corresponding hole (not shown), respectively, to assist in module alignment.

Figure 3:
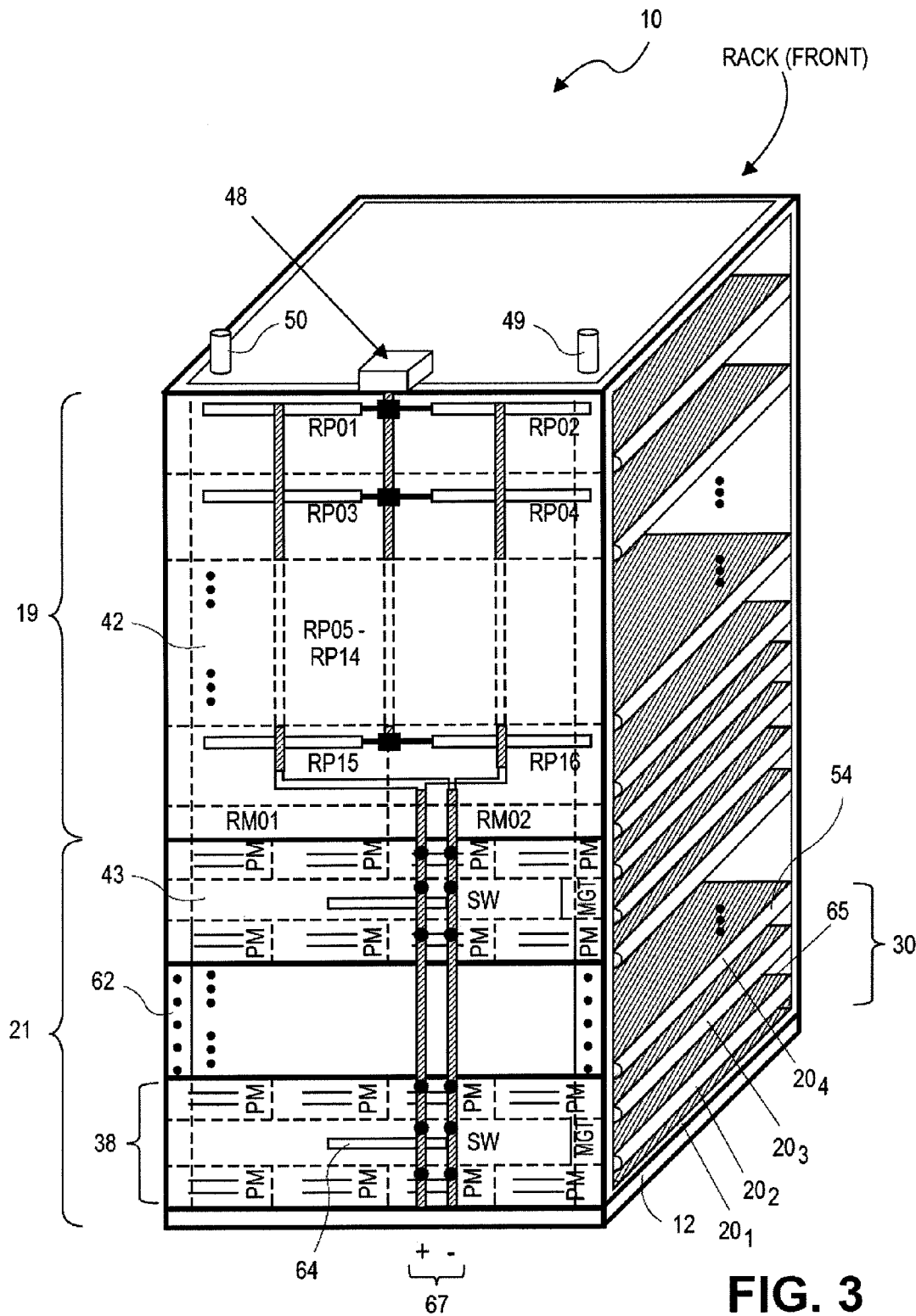
FIG. 3 illustrates an embodiment of rack system and specifically the rear portion and the open side of the rack and the cooled universal hardware platform.

FIG. 3 is an embodiment of rack system 10 illustrating the rear portion and the open side of the rack. As shown, FIG. 3 only represents a portion of the entire rack system 10, and specifically, only portions of the rack power section 19 and the universal hardware platform 21. This embodiment illustrates the power inlet 48 coupled to a power bus 67 via the rack power and management backplane 42, which as previously mentioned may convert AC power from the power inlet 48 to DC power for distribution to the service units via the service unit backplanes of the universal hardware platform 21.

In one embodiment, the power bus 67 includes two solid conductors; a negative or ground lead and a positive voltage lead connected to the rack power and management backplane 42 as shown. The power bus 67 may be rigidly fixed to the rack power and management backplane 42 or may only make electrical connection but be rigidly fixed to the backplanes as needed, such as the cluster unit backplanes 38 and 43. In another embodiment where DC power is supplied directly to the power inlet 48, the power bus 67 may be insulated and rigidly fixed to the rack system 10. Regardless of the embodiment, the power bus 67 is configured to provide power to any functional type of backplane mounted in the universal hardware platform 21. The conductors of the power bus 67 may be electrically connected to the service unit backplanes by various connector types. For example, the power bus 67 may be a metallic bar which may connect to each backplane using a bolt and a clamp, such as a D-clamp.

FIG. 3 also illustrates another view of the cooled partitions of the rack system 10. This embodiment shows the coolant distribution node 54 that is part of the cooled partitions shown, such as the cooled partitions $20_1$, $20_2$, $20_3$, and $20_4$ of module bays 30, and also shows a side view of the middle module bay, module bay 65. As discussed above, the coolant distribution node 54 may be connected to the coolant distribution nodes of the other cooled partitions via coolant pipes 61 and 63 (see e.g., FIGS. 2 and 5) running up the rack and to the coolant inlet 49 and the coolant outlet 50.

Figure 4:
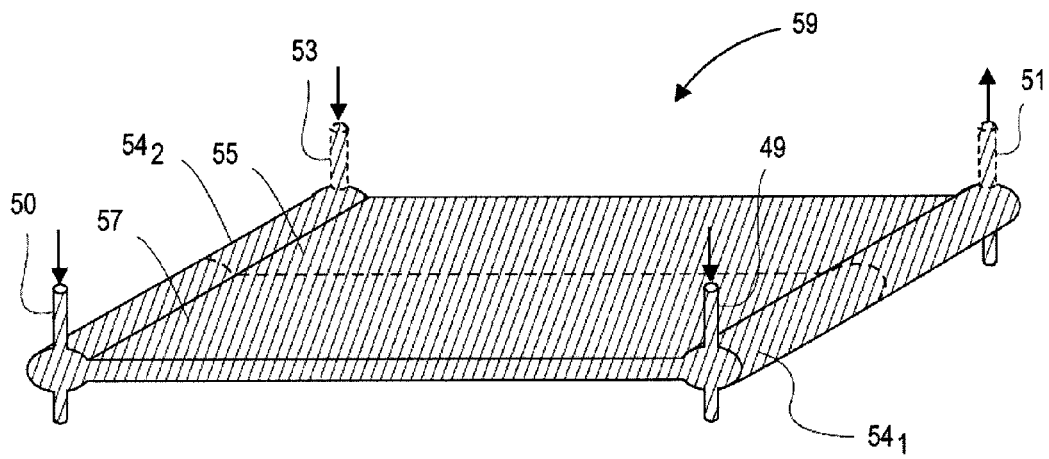
FIG. 4 illustrates an embodiment of a cooled partition found within the rack system.

FIG. 4 is an embodiment of a cooled partition 59. The cooled partition 59 includes coolant distribution nodes $54_1$ and $54_2$, which are connected to the coolant inlet 49 and the coolant outlet 50, respectively. The cooled partition 59 internally includes channels (not shown) that facilitate coolant flow between each coolant distribution node $54_1$ and $54_2$ to cool each side of the cooled partition 59. The internal channels may be configured in any suitable way known in the art, such as a maze of veins composed of flattened tubing, etc. The coolant distribution nodes $54_1$ and $54_2$ may include additional structures to limit or equalize the rate and distribution of coolant flow along the each axis of the coolant distribution node and through the cooled partition. Additionally, the coolant inlet 49 and the coolant outlet 50 may be caddy-corner or diagonal to each other depending on the rack design and the channel design through the cooled partition 59.

In another embodiment, the cooled partition 59 may be divided into two portions, partition portion 55 and partition portion 57. Partition portion 57 includes existing coolant inlet 49 and coolant outlet 50. However, the partition portion 55 includes its own coolant outlet 51 and coolant inlet 53. The partition portions 55 and 57 may be independent of each other and have their own coolant flow from inlet to outlet. For example, the coolant flow may enter into coolant inlet 49 of partition portion 57, work its way through cooling channels and out o the coolant outlet 50. Similarly, coolant flow may enter coolant inlet 53 of partition portion 55, through its internal cooling channels and out of coolant outlet 51. In another embodiment, the coolant inlet 49 and the coolant inlet 53 may be on the same side of the partition portion 55 and the partition portion 57, respectively. Having the coolant inlets and outlets on opposite corners may have beneficial cooling characteristics in having a more balanced heat dissipation throughout the cooled partition 59.

In another embodiment, the partition portions 55 and 57 are connected such that coolant may flow from one partition portion to the next either through one or both of the coolant distribution nodes $54_1$ and $54_2$ and through each partition portions' cooling channels. In this embodiment, based on known coolant flow characteristics, it may be more beneficial to have the coolant inlet 49 and the coolant inlet 53 on the same side of the partition portion 55 and the partition portion 57, and similarly the outlets 50 and 51 on the side of the partition portions 55 and 57.

Figure 5:
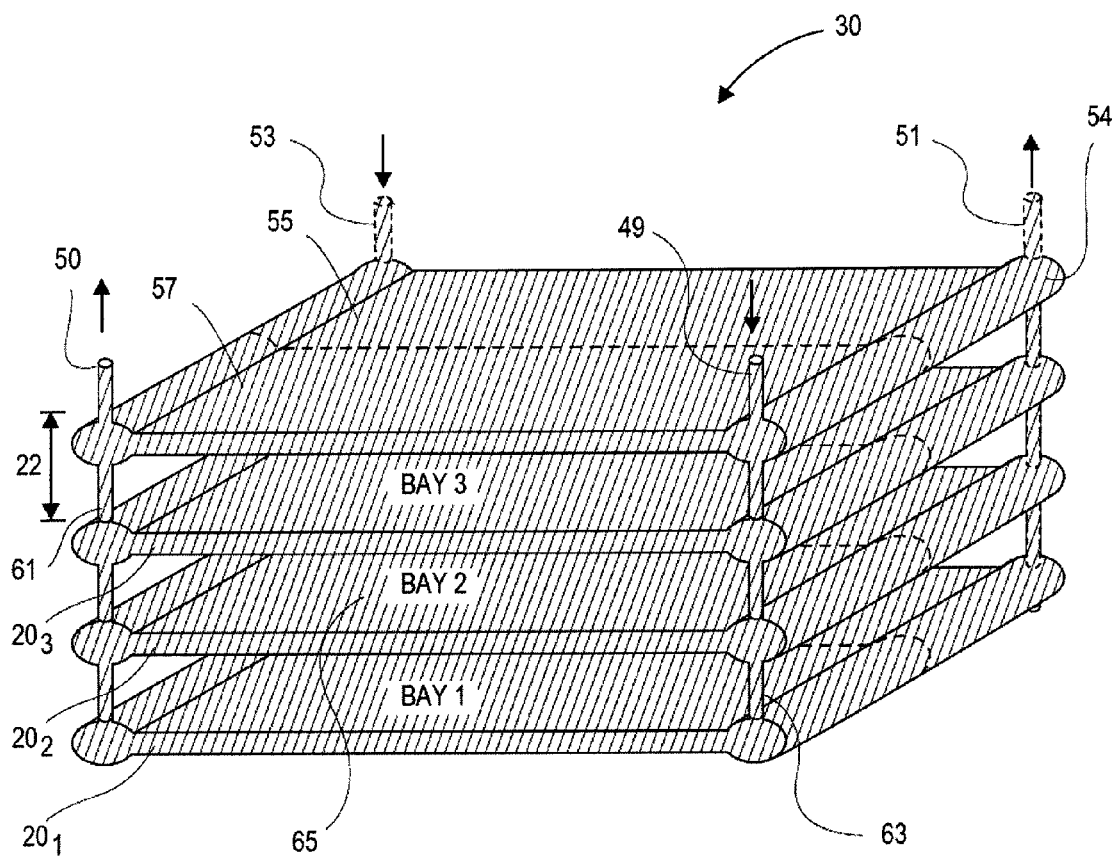
FIG. 5 illustrates an embodiment of several cooled partitions making up the module bays as viewed outside of the rack system.

FIG. 5 is an embodiment of the cooled partitions $20_1$, $20_2$, $20_3$, and $20_4$ of module bays 30 outside of the rack system 10 and provides another illustration of the module bay 65. Each cooled partition may have the same functionality as described in FIG. 4 with respect to cooled partition 59. Each cooled partition is physically connected by the coolant pipe 61 and the coolant pipe 63, which provide system wide coolant flow between all cooled partitions within the rack system 10. As with the cooling partition 59 of FIG. 4, in another embodiment the cooled partitions $20_1$, $20_2$, $20_3$, and $20_4$ may have an additional coolant outlet 51 and coolant inlet 53 and associated piping similar to coolant pipes 61 and 63. In other embodiments, the configuration of the inlets and outlets may vary depending on the desired coolant flow design. For example, the two inlets may be on opposite diagonal corners or on the same side depending on the embodiment designed to, such as including partition portions, etc., as discussed above with reference to FIG. 4.

In one embodiment, the bottom and top surfaces of the cooled partitions $20_1$, $20_2$, $20_3$, and $20_4$ are heat conductive surfaces. Because coolant flows between these surfaces they are suited to conduct heat away from any fixture or apparatus placed in proximity to or in contact with either the top or bottom surface of the cooled partitions, such as the surfaces of cooled partitions $20_2$ and $20_3$ of module bay 65. In various embodiments, the heat conductive surfaces may be composed of many heat conductive materials known in the art, such as aluminum alloy, copper, etc. In another embodiment, the heat conductive surfaces may be a mixture of heat conducting materials and insulators, which may be specifically configured to concentrate the conductive cooling to specific areas of the apparatus near or in proximity to the heat conductive surface.

FIGS. 6 and 7 are each embodiments of a module fixture 70 that may include circuit cards and components that make up a functional module in a service unit, such as the four processing modules 32 insertable into the module bay 65 as discussed with reference to FIGS. 1, 2, and 5. The module fixture 70 includes thermal plates 71 and 72, fasteners 73, tensioners $74_1$ and $74_2$, component 75, connector 76, connector 77, and component boards 78 and 79.

In one embodiment, the component boards 78 and 79 are a multi-layered printed circuit board (PCB) and are configured to include connectors, nodes and components, such as component 75, to form a functional circuit. In various embodiments, the component board 78 and the component board 79 may have the same or different layouts and functionality. The component boards 78 and 79 may include the connector 77 and the connector 76, respectively, to provide input and output via a connection to the backplane (e.g., cluster unit backplane 38) through pins or other connector types known in the art. Component 75 is merely an example component and it can be appreciated that a component board may include many various size, shape, and functional components that still may receive the unique benefits of the cooling, networking, power and form factor of the rack system 10.

The component board 78 may be mounted to the thermal plate 71 using fasteners 73 and, as discussed below, will be in thermal contact with at least one and preferably two cooled partitions when installed into the rack system 10. In one embodiment, the fasteners 73 have a built in standoff that permits the boards' components (e.g., component 75) to be in close enough proximity to the thermal plate 71 to create a thermal coupling between the component 75 and at least a partial thermal coupling to the component board 78. In one embodiment the component board 79 is opposite to and facing the component board 78 and may be mounted and thermally coupled to the thermal plate 72 in a similar fashion as component board 78 to thermal plate 71.

Because of the thermal coupling of the thermal plates 71 and 72—which are cooled by the cooling partitions of the rack system 10—and the components of the attached boards, (e.g., component board 78 and component 75) there is no need to attach a heat-dissipating component, such as a heat sink, to the components. This allows the module fixture 70 to have a low profile permitting a higher density or number of module fixtures, components, and functionality in a single rack system, such as the rack system 10 and in particular the portion that is the universal hardware platform 21.

In another embodiment, if a component height is sufficiently higher than another component mounted on the same component board, the lower height component may not have a sufficient thermal coupling to the thermal plate for proper cooling. In this case, the lower height component may include a heat-dissipating component to ensure an adequate thermal coupling to the thermal plate.

In one embodiment, the thermal coupling of the thermal plates 71 and 72 of the module fixture 70 is based on direct contact of each thermal plate to their respective cooled partitions, such as the module bay 65 which include cooled partitions $20_3$ and $20_4$ shown in FIGS. 2, 3, and 5 above. To facilitate the direct contact, thermal plates 71 and 72 may each connect to an end of a tensioning device, such as tensioners $74_1$ and $74_2$. In one embodiment, the tensioners are positioned on each side and near the edges of the thermal plates 71 and 72. For example, tensioners $74_1$ and $74_2$ may be springs in an uncompressed state resulting in a module fixture height $h_1$, as shown in FIG. 6, where $h_1$ is larger than the height of the module bay 65 including cooled partitions $20_3$ and $20_4$.

FIG. 7 illustrates the module fixture 70 when the thermal plates 71 and 72 are compressed towards each other to a height of $h_2$, where $h_2$ is less than or equal to the height or distance between the cooled partitions $20_3$ and $20_4$ of the module bay 65. Thus, when the module fixture is inserted into the module bay 65 there is an outward force 80 and an outward force 81 created by the compressed tensioners $74_1$ and $74_2$. These outward forces provide a physical and thermal contact between the cooled partitions $20_3$ and $20_4$ and the thermal plates 71 and 72. As coolant flows through each partition, as described with respect to FIG. 5, it conductively cools the boards and components of the module fixture 70.

The tensioners $74_1$ and $74_2$ may be of any type of spring or material that provides a force creating contact between the thermal plates and the cooling partitions. The tensioners $74_1$ and $74_2$ may be located anywhere between the thermal plates 71 and 72, including the corners, the edges or the middle, and have no limit on how much they may compress or uncompress. For example, the difference between $h_1$ and $h_2$ may be as small as a few millimeters or as large as several centimeters. In other embodiments, the tensioners $74_1$ and $74_2$ may pass through the mounted component boards or be between and couple to the component boards or any combination thereof. The tensioners may be affixed to the thermal plates or boards by any fastening hardware, such as screws, pins, clips, etc.

FIGS. 8 and 9 are embodiments of the module fixture 70 from a side view in a compressed and uncompressed state respectively. As shown in FIGS. 6 and 7 the connectors 76 and 77 do not overlap, and in this embodiment, are on different sides as seen from the back plane view. FIGS. 8 and 9 further illustrate the connectors 76 and 77 extend out from the edge of the thermal plates 71 and 72 such that they may overlap the thermal plates when the module fixture 70 is compressed down to the height of $h_2$. For example, the connector 76 of the bottom component board 79, when compressed, is relatively flush with the thermal plate 71 on top and the connector 77 of the top component board 78 is relatively flush with the thermal plate 72 on the bottom. In this particular embodiment, the connectors 76 and 77 will determine the minimum $h_2$, or in other words how much the fixture 70 may be compressed. The smaller the fixture 70 may be compressed the smaller the pitch (P) may be between cooling partitions and the higher the density of functional components per rack system, and specifically the universal hardware platform 21 portion of the rack system 10.

FIGS. 10 and 11 are each embodiments of a module fixture 89 for a rack power board insertable into the rack power section 19 of the rack system 10. The module fixture 89 includes a thermal plates 87 and 88, fasteners 83, tensioners $84_1$ and $84_2$, component 85, connector 86, and component board 82.

Thus, in a similar way as described above with respect to the module fixture 70 in FIGS. 6 and 7, when the module fixture is inserted into a module bay in the rack power section 19 there is an outward force 90 and an outward force 91 created by the compressed tensioners $84_1$ and $84_2$. These outward forces provide a physical and thermal contact between the cooled partitions of the rack power section 19 and the thermal plates 87 and 88. Therefore, the component board 82 and components (e.g., component 85) of the module fixture 89 are conductively cooled as coolant flows through the relevant cooled partitions.

Although an embodiment of the present invention has been described with reference to specific example embodiments, it will be evident that various modifications and changes may be made to these embodiments without departing from the broader spirit and scope of the invention. Accordingly, the specification and drawings are to be regarded in an illustrative rather than a restrictive sense.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A rack frame, comprising:
a module insertion area on a first side of the rack frame;
a universal backplane area on a second side of the rack frame opposite to the first side, the universal backplane area including at least one mounting surface configured to mount two or more backplane boards, wherein at least two of the two or more backplane boards are configured to couple to two respective modules each having at least two different functions and being insertable through the module insertion area, wherein the at least two different functions of at least one of the two respective modules may include rack power and management functions;
a plurality of modules including the two respective modules;
a power bus to provide power to the two or more backplane boards mounted in the universal backplane area;
a plurality of shelves coupled within the rack frame and configured to support the plurality of modules, the plurality of shelves substantially parallel to each other and substantially perpendicular to the module insertion area and the two or more backplane boards, each shelf including a first surface and a second surface, wherein the first surface of a first shelf is opposite to the second surface of an adjacent second shelf;
a plurality of bays defined by the plurality of shelves, wherein each bay has a pitch (P) equal to a distance between the first surface of the first shelf to the second surface of the adjacent second shelf; and
wherein:
at least one of the at least two backplane boards is configured to mount across at least three bays of the plurality of bays;
the rack frame further includes a service unit including multiple server modules and a network switch module of the plurality of modules, the at least one of the at least two backplane boards configured to receive a plurality of the multiple server modules per bay over multiple bays of the plurality of bays and the network switch module in another bay of the plurality of bays; and
the at least one of the at least two backplane boards is configured to mount across seven bays of the plurality of bays, the service unit includes forty-eight server modules and the network switch module, and wherein the at least one of the at least two backplane boards is configured to receive eight server modules of the forty-eight server modules per bay over six bays of the seven bays and the network switch module in a seventh bay of the seven bays.

2. The rack frame of claim 1, wherein each of the forty-eight server modules and the network switch module comprises a first plate substantially parallel to a second plate, wherein each plate of the first plate and the second plate includes an inner surface and an outer surface, the inner surface of the first plate facing the inner surface of the second plate and the outer surface of the first plate facing opposite to the outer surface of the second plate, the inner surface of at least one of the first plate or the second plate being configured to provide a mounting surface for one or more component units.

3. A rack frame, comprising: a module insertion area on a first side of the rack frame; a universal backplane area on a second side of the rack frame opposite to the first side, the universal backplane area including at least one mounting surface configured to mount two or more backplane boards, wherein at least two of the two or more backplane boards are configured to couple to two respective modules each having at least two different functions and being insertable through the module insertion area, wherein the at least two different functions of at least one of the two respective modules may include rack power and management functions; a plurality of modules including the two respective modules; and a power bus to provide power to the two or more backplane boards mounted in the universal backplane area; and wherein the universal backplane area includes a plurality of backplane board mounts and a vertical distance between any two of the backplane board mounts is configured to conform to a multiple of a standard distance of height.

4. The rack frame of claim 3, further comprising a plurality of shelves coupled within the rack frame and configured to support the plurality of modules, the plurality of shelves substantially parallel to each other and substantially perpendicular to the module insertion area and the two or more backplane boards, each shelf including a first surface and a second surface, wherein the first surface of a first shelf is opposite to the second surface of an adjacent second shelf.

5. The rack frame of claim 4, further comprising a plurality of bays defined by the plurality of shelves, wherein each bay has a pitch (P) equal to a distance between the first surface of a first shelf to the second surface of an adjacent second shelf.

6. The rack frame of claim 5, wherein:
at least one of the at least two backplane boards is configured to mount across at least three bays of the plurality of bays; and
the rack frame further includes a service unit including multiple server modules and a network switch module of the plurality of modules, wherein the at least one of the at least two backplane boards is configured to receive a plurality of the multiple server modules per bay over multiple bays of the plurality of bays and the network switch module in another bay of the plurality of bays.

7. The rack frame of claim 5, wherein the rack frame includes at least two different pitch (P) values.

8. The rack frame of claim 5, further comprising a cooling system coupled to the plurality of shelves separating each bay of the plurality of bays.

9. The rack frame of claim 5, further comprising a cooling system configured to provide airflow through the plurality of bays to cool one or more component units in each module of the plurality of modules.

10. The rack frame of claim 5, wherein the pitch (P) corresponds with the standard distance of height.

11. The rack frame of claim 10, wherein the standard unit of distance is 0.75 inches.

12. The rack frame of claim 4, further comprising a cooling system is configured to provide coolant flow within each of the the plurality of shelves and wherein:
each of the plurality of modules includes a first plate substantially parallel to a second plate wherein each plate of the first plate and the second plate includes an inner surface and an outer surface, the inner surface of the first plate facing the inner surface of the second plate and the outer surface of the first plate facing opposite to the outer surface of the second plate, the inner surface of at least one of the first plate or the second plate being configured to provide a mounting surface for one or more component units; and
the at least one of the first plate or the second plate of each of the plurality of modules is configured to thermally couple the one or more component units to a shelf of the plurality of shelves.

13. The rack frame of claim 3, wherein each of the plurality of modules includes:
a first plate substantially parallel to a second plate, wherein each plate of the first plate and the second plate includes an inner surface and an outer surface, the inner surface of the first plate facing the inner surface of the second plate and the outer surface of the first late facing opposite to the outer surface of the second plate, the inner surface of at least one of the first plate or the second plate being configured to provide a mounting surface for one or more component units; and one or more tensioning units coupled to and locatable between the first and the second plates, the one or more tensioning units configured to generate a bias that urges the first plate away from the second plate.

14. The rack frame of claim 3, wherein the plurality of backplane board mounts are holes configured to be used in conjunction with a fastener and the two or more backplane boards are configured to conform to a multiple of the standard distance of height.

15. The rack frame of claim 3, wherein the plurality of backplane board mounts are protruding elements configured to be used in conjunction with a fastener and the two or more backplane boards are configured to conform to a multiple of the standard distance of height.

16. The rack frame of claim 3, including a rack power unit coupled within the frame and comprised of one or more rack power modules of the plurality of modules to convert alternating current (AC) to direct current (DC).

17. A universal backplane comprising: a first backplane board; and a second backplane board, wherein each backplane board includes a plurality of connector receptacles, each connector receptacle being configured to receive backplane connectors from respective ones of a plurality of modules that are mountable in a same side of a rack to which the first and second backplane boards are connectable, wherein at least one of the first backplane board or the second backplane board comprises a fixed function backplane board for handling power and management control functions of the modules insertable into the rack, and wherein the first backplane board and the second backplane board are configured to mount to the rack, the rack including a plurality of backplane board mounts, wherein a vertical distance between any two of the backplane board mounts is configured to conform to a multiple of a standard distance of height.

18. The universal backplane of claim 17, wherein each of the first and second backplane boards is configured to have a size and arrangement of the backplane connector receptacles that corresponds to a number and position of respective modules of the plurality of modules positioned proximate thereto within the rack.

19. The universal backplane of claim 17, wherein at least one of the first backplane board or the second backplane board comprises a function other than handling power and management control functions.

* * * * *